United States Patent [19]

Hua et al.

[11] Patent Number: 5,127,984
[45] Date of Patent: Jul. 7, 1992

[54] RAPID WAFER THINNING PROCESS

[75] Inventors: Chang-Hwang Hua, Palo Alto; Ding Y. S. Day, Sunnyvale, both of Calif.

[73] Assignee: Avantek, Inc., Milpitas, Calif.

[21] Appl. No.: 694,904

[22] Filed: May 2, 1991

[51] Int. Cl.$^5$ .................. H01L 21/306; B44C 1/22
[52] U.S. Cl. .................. 156/639; 156/640; 156/655; 156/662; 156/630; 156/345; 252/79.5
[58] Field of Search ............... 156/630, 638, 639, 640, 156/654, 655, 662, 345; 252/79.5

[56] References Cited

U.S. PATENT DOCUMENTS

| | | | |
|---|---|---|---|
| 3,801,391 | 4/1974 | Dyment et al. | 156/16 |
| 3,841,930 | 10/1974 | Hetrich | 156/639 X |
| 3,910,803 | 10/1975 | Howarth et al. | 156/639 X |
| 4,026,741 | 5/1977 | Chang et al. | 156/628 |
| 4,295,923 | 10/1981 | Kasper | 156/630 |
| 4,317,698 | 3/1982 | Christol et al. | 156/626 |
| 4,372,803 | 2/1983 | Gigante | 156/626 |
| 4,380,490 | 4/1983 | Aspnes et al. | 156/662 |
| 4,557,785 | 12/1985 | Ohkuma | 156/345 |
| 4,857,142 | 8/1989 | Syverson | 156/639 X |

FOREIGN PATENT DOCUMENTS

| | | |
|---|---|---|
| 59-103344 | 6/1984 | Japan . |
| 60-35520 | 2/1985 | Japan . |
| 61-111546 | 5/1986 | Japan . |
| 62-72179 | 4/1987 | Japan . |

OTHER PUBLICATIONS

James M. O'Connor et al., Rapid Controlled Thinning of Gallium Arsenide, J. Electrochem. Soc., Solid-State Science and Technology, Jan. 1988, pp. 190-193.
Applied Process Technology, Inc., Model 9165 Gallium Arsenic Wafer Etcher.

Primary Examiner—William A. Powell
Attorney, Agent, or Firm—Philip M. Shaw, Jr.

[57] ABSTRACT

A method for thinning a Gallium Arsenide (GaAs) layer on the backside of a wafer substrate is provided. The method involves spraying an etchant solution including $NH_4OH$ and $H_2O_2$, preferably in a 1:4 ratio, onto the GaAs layer as the wafer is rotated at approximately 2000 rpm. The etchant is sprayed through a plurality of spray nozzles. The process is capable of thinning a GaAs layer by about 500 $\mu$m in approximately 14 to 18 minutes, depending on the etchant temperature and composition.

14 Claims, 2 Drawing Sheets

RAPID WAFER THINNING PROCESS

FIELD OF THE INVENTION

The invention relates to semiconductor processing. In particular, the invention is an etching process involving spraying an $NH_4OH/H_2O_2$ etchant solution onto a Gallium Arsenide (GaAs) layer on the backside of a wafer.

BACKGROUND OF THE INVENTION

GaAs is a compound which is commonly used in semiconductor wafers. The material may either be used on the frontside or the backside of the semiconductor wafer. When GaAs is used on the wafer frontside, it is typically necessary to decrease the GaAs thickness by small amounts, for example, less than one micron, to manufacture the integrated circuit. Whereas, when GaAs is used on the backside of a wafer it is often necessary to decrease the GaAs thickness by a much greater amount, for example, up to 500 microns. Therefore, different processing steps have been developed for thinning GaAs layers, depending on whether frontside or backside thinning is desired.

One process which is commonly used to thin GaAs on the backside of a semiconductor wafer is known as a back lap process. This technique involves the use of wax to mount the wafer, backside up, on a carrier which is then mounted on a block. Wet alumina is deposited between the wafer backside and a lapping wheel. The wheel is then rotated so that the GaAs is gradually removed by physically grinding the wet alumina against the wafer backside. After most of the desired thinning has been achieved, the wafer surface must be polished by grinding again with a finer grain.

There are several significant drawbacks with the back lap thinning process. First, it is very difficult to uniformly thin the GaAs layer with this method. The wafer mounting steps on the carrier and the block are extremely critical. If the wafer is not mounted perfectly even, the lapping wheel will not uniformly lap the GaAs layer. Second, the back lap thinning process is very time consuming. For a 3" wafer it can take up to approximately three hours to thin 500 microns off of a GaAs layer. Third, the back lap procedure is a dirty process which must be performed outside the clean room environment.

Another commonly used GaAs thinning process involves immersing the wafer in an etchant solution. In this approach a wafer is mounted on a carrier, backside up. The carrier and wafer are usually then suspended in an etchant solution contained in a vessel such as a beaker. During the etching process the beaker is rotated and tilted to cause uniform circulation of the etchant around the wafer. The amount of GaAs thinning is supposedly controlled by controlling the immersion time. One notable problem with the immersion approach is that in order to achieve the GaAs thinning in the desired time frame, highly toxic etchant materials, such as hydrofluoric acid, nitric acid or acetic acid, are typically used. Another problem with this approach is that it is difficult to achieve the desired thickness uniformity in actual production or when processing large wafers.

SUMMARY OF THE INVENTION

An object of the present invention is to provide a process which is capable of rapidly and uniformly thinning a GaAs layer on the backside of a wafer without requiring highly toxic etchants or critical wafer mounting steps.

The method of the present invention involves, first, measuring the thickness of a GaAs layer on the backside of a wafer. Second, the wafer is mounted on a carrier so that the wafer's frontside faces the carrier and the wafer's backside is exposed. The carrier is then attached to a rotatable chuck, the chuck being located below a plurality of spray nozzles which are substantially aimed at the backside of the wafer. An etchant solution containing approximately 1 part $NH_4OH$ to 4 parts $H_2O_2$ is prepared and stored in a reservoir which is attached to the spray nozzles. The actual thinning process is then commenced by rotating the chuck, while simultaneously spraying the etchant out of the nozzles onto the wafer backside during the rotating step until the desired GaAs layer thickness is obtained.

DETAILED DESCRIPTION OF THE PREFERRED EMBODIMENTS

Figure 1:
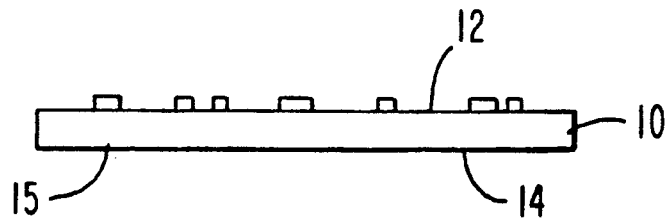
FIG. 1 is a side view of a semiconductor wafer having a GaAs layer.

A method for thinning a GaAs substrate using a spray etcher to perform a wet chemical etch has been developed. A mixture of liquid $NH_4OH$ and $H_2O_2$ is deposited on the backside of a rotating wafer at a controlled temperature to achieve an etch rate of 30 $\mu$m/min with excellent uniformity across 2 inch and 3 inch wafers. The method of the present invention avoids the need for a heavy lapping block, alumina grit, critical wafer mounting, and surface uniformity of the wafer carrier. It is a clean process and only takes one thinning step, since it does not require a separate polishing step.

A typical thinning procedure of the present invention proceeds as follows. First, the thickness of a GaAs wafer is measured and then the wafer is mounted on the carrier with wax. The thickness measurement is used to calculate the etching time.

Next, a $NH_4OH:H_2O_2$ etchant mixture is prepared. The following chemical ratios are based on the assumptions that the $NH_4OH$ is obtained from an aqueous stock solution which is approximately 28–30% (V/V) $NH_4OH$, and the $H_2O_2$ is obtained from an aqueous stock solution which is approximately 30% (V/V) $H_2O_2$. The etchant mixture is made by mixing the $NH_4OH$ stock solution with the $H_2O_2$ stock solution in a ratio of between 1:1 and 1:10. The preferred ratio is 1 part $NH_4OH$ stock solution to 4 parts $H_2O_2$ stock solution. The etchant solution is then poured into the canisters of a temperature controlled, multiple nozzle spray etcher. For example, the Automated GaAs Etcher made by Applied Process Technology, Inc. (APT) in Santa Clara, Calif., works well for this purpose.

The GaAs wafer is mounted on a carrier, for example, sapphire, using wax to fix the frontside of the wafer against the carrier surface so that the wafer's backside is upwardly exposed. The mounted wafer is then loaded onto a rotatable chuck which is disposed below a plurality of spray nozzles. In particular, three spray nozzles have been found to produce superior results. It is also preferred that the carrier be mounted on the chuck so that the wafer is substantially above the chuck's axis of rotation.

Etching is then commenced by depositing etchant through the spray nozzles while simultaneously rotating the chuck. The chuck should be rotated at a speed of at least 1000 rpm, and preferably at 2000 rpm. The chuck rotation speed is important. If the chuck is rotated too fast, centrifugal force will cause the deposited etchant to be spun off the wafer before it has adequate time to react. Whereas, if the chuck is rotated too slowly, the GaAs which has been oxidized and solubilized is not efficiently removed so as to allow newly deposited etchant to react at the wafer's surface.

The amount of etchant which is deposited onto the wafer per unit time is also important. Preferably, 200 to 400 mls of etchant per minute is deposited onto the rotating wafer. In order to deposit this quantity of etchant with the APT automated etcher it is necessary to operate at least three spray nozzles simultaneously. However, a fewer number of spray nozzles could be used provided the total etchant output per unit time is in accordance with the range mentioned above.

After a predetermined time, the wafer will be thinned to the desired thickness with a smooth surface. There is no need for a final polishing step as is required in the back lap thinning process of the prior art. The etch time is dependent on the thickness of the wafer and the solution temperature. For instance, a solution temperature of 45° C. yields an etch rate of 30 $\mu$m/min. In general, the process takes 14 to 18 minutes to thin a 2 or 3 inch wafer to 75 $\mu$m thickness. This time range may be reasonably expanded to approximately 5 to 20 minutes by varying the $H_2O_2$ concentration, the etchant temperature, and depending on the total amount of thinning which is desired. The uniformity across the wafer can be controlled with a variation of $\pm 5.0$ $\mu$m for a 2 inch wafer and $\pm 7.5$ $\mu$m for a 3 inch wafer respectively.

The following discussion, with reference to the drawings, illustrates an embodiment of the claimed invention.

FIG. 1 shows a wafer 10 having a frontside 12 and a backside 14. The wafer 10 has a GaAs layer 15 on its backside.

Figure 2:
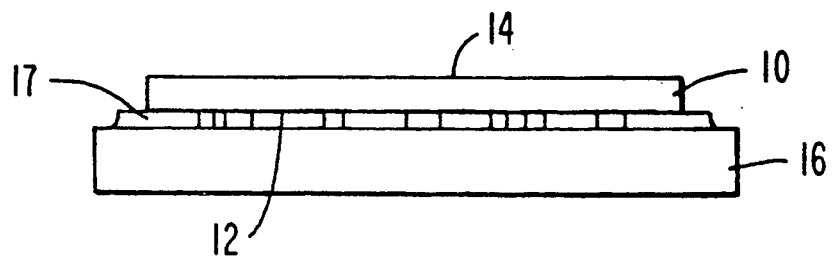
FIG. 2 is a side view of a GaAs substrate mounted on a carrier.

FIG. 2 shows a wafer 10 mounted on a carrier 16. The wafer's frontside 12 faces the carrier 16, while the wafer's backside 14 is upwardly exposed. The wafer 10 is typically attached to the carrier 16 by a wax layer 17 which protects the wafer's frontside from etchant decomposition.

Figure 3:
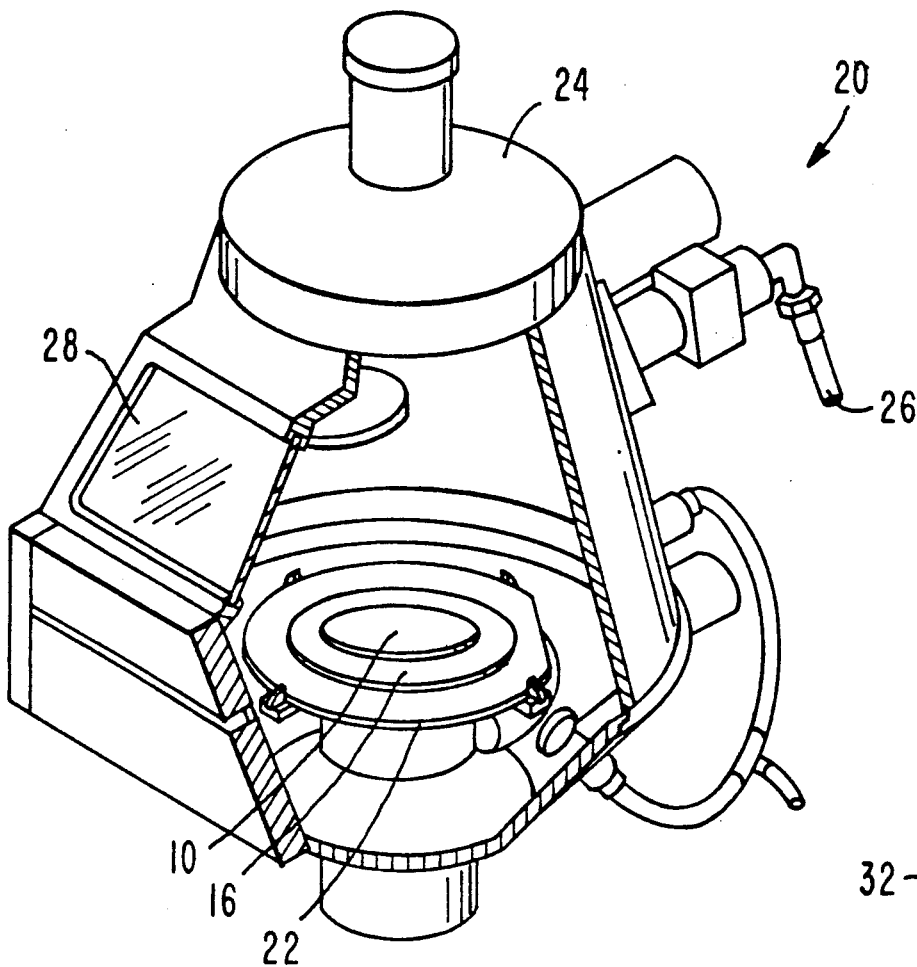
FIG. 3 is a perspective sectional view of a spray etcher which is used in an embodiment of the present invention.

FIG. 3 shows a spray etcher 20 which can be used to deposit the etchant on the backside of the wafer 10. The etcher 20 has a rotatable chuck 22 which is disposed below a head portion 24 which supports at least three spray nozzles. A tube 26 connects the etchant reservoir to the etcher unit 20 in order to supply etchant to the spray nozzles. A housing 28 is provided around the chuck and nozzle assembly in order to contain the spray.

Figure 4:
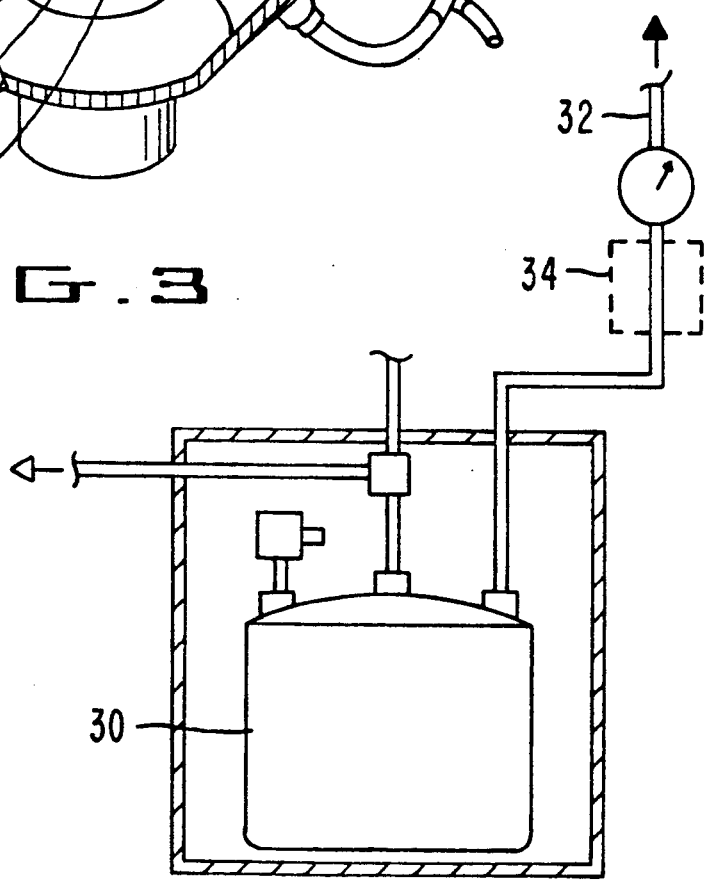
FIG. 4 is a side view of an etchant reservoir in an embodiment of the present invention.

FIG. 4 shows an etchant reservoir 30 which has a pipe 32 connected to the etcher tube 26 so that the etchant solution can be readily supplied to the nozzles in the etcher head 24.

It is preferable to also provide a temperature control unit 34 for maintaining a constant etchant temperature, since the etchant temperature will affect the speed of the thinning process.

Figure 5:
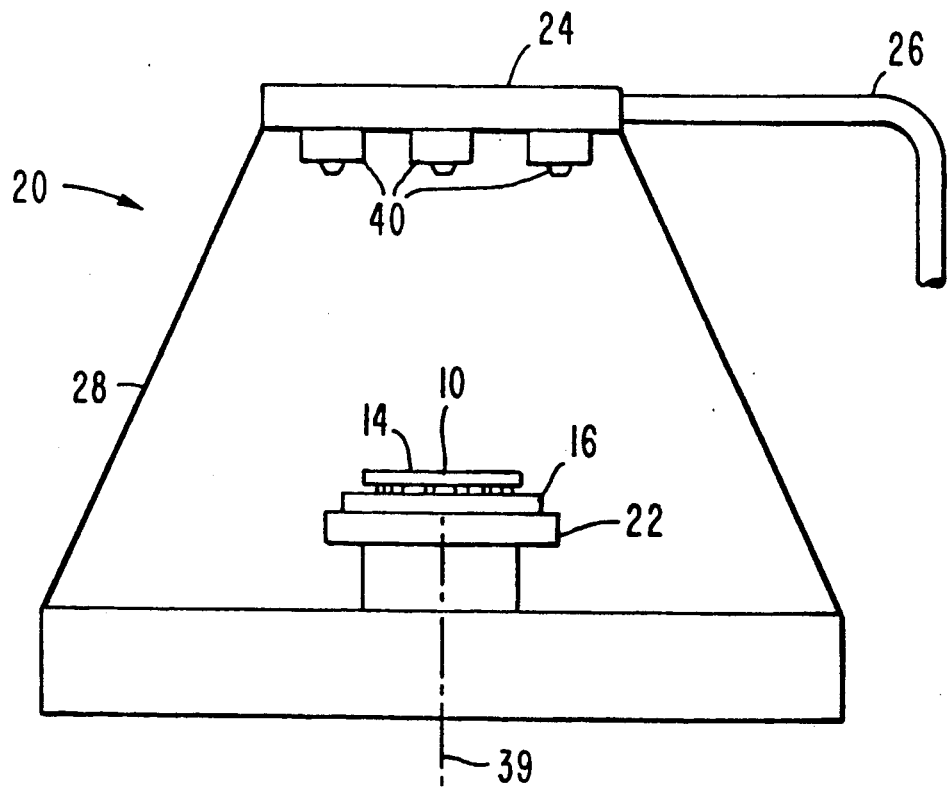
FIG. 5 is a side view of a portion of a spray etcher which is used in an embodiment of the present invention.

FIG. 5 shows a side view of a portion of a spray etcher in an embodiment of the present invention. The wafer carrier 16 is mounted in substantially the center of the chuck 22 over the axis of rotation 39. The backside of the wafer 14 is upwardly exposed. Three spray nozzles 40 are directed towards the wafer's backside 14. It is preferable that the nozzles 40 be positioned with respect to the wafer 10 so that the etchant is uniformly deposited around the wafers backside surface.

Although specific embodiments of the present invention have been described in detail above, the claimed invention is intended to include variations which would be obvious to a person having ordinary skill in the art. For example, the claimed process may be used to thin other wafer materials such as Aluminum Gallium Arsenide or Indium Phosphide.

We claim:

1. A method for uniformly thinning a GaAs layer on the backside of a semiconductor layer, comprising the steps of:
   measuring the thickness of a GaAs layer on a wafer;
   mounting the wafer on a carrier, wherein the wafer has a frontside and a backside, the wafer being mounted so that its frontside faces the carrier and the wafer backside is exposed;
   attaching the carrier to a rotatable chuck, the chuck being located below a spraying means which is substantially directed at the backside of the wafer;
   preparing an etchant comprising $NH_4OH$ and $H_2O_2$;
   rotating the chuck;
   spraying the etchant out of the spraying means onto the wafer backside during the rotating step until the desired GaAs layer thickness is obtained.

2. The method of claim 1 wherein the spraying step includes the step of depositing approximately between 200 to 400 mls of etchant per minute onto the wafer backside.

3. The method of claim 2 wherein the spraying means includes at least three spray nozzles.

4. The method of claim 1 wherein the ratio of $NH_4OH$ to $H_2O_2$ in the etchant is between 1:1 and 1:10 and the $H_2O_2$ is at least about 15% (V/V).

5. The method of claim 4 wherein the ratio of $NH_4OH$ to $H_2O_2$ is 1:4.

6. The method of claim 1 wherein the chuck has an axis of rotation, the wafer carrier being attached to the chuck directly on top of the chuck's axis of rotation.

7. The method of claim 1 wherein the spraying step lasts for between five and twenty minutes.

8. The method of claim 1 wherein the rotation speed of the chuck in the rotating step is between 1000 and 2000 rpm.

9. The method of claim 8 wherein the rotation speed of the chuck in the rotating step is approximately 2000 rpm.

10. The method of claim 1 further comprising the step of controlling the temperature of the etchant.

11. The method of claim 10 wherein the temperature of the etchant is maintained at approximately 45° C.

12. A method of uniformly thinning a GaAs layer on the backside of a semiconductor wafer comprising the steps of:

determining the thickness of a GaAs layer on the backside of a semiconductor wafer;

mounting said wafer on a carrier, exposing said layer; and rotating said carrier at a speed of at least 1000 rpm while spraying an etchant comprising $NH_4OH$ and $H_2O_2$ onto said layer from a spraying means positioned above said carrier for a period of time sufficient to etch the desired thickness of GaAs away.

13. The method of claim 12 wherein the spraying step includes the step of depositing approximately between 200 to 400 mls of etchant onto the wafer backside.

14. The method of claim 13 wherein the spraying means includes at least three spray nozzles.

* * * * *